United States Patent [19]
Wang et al.

[11] Patent Number: 5,702,989
[45] Date of Patent: Dec. 30, 1997

[54] METHOD FOR FABRICATING A TUB STRUCTURED STACKED CAPACITOR FOR A DRAM CELL HAVING A CENTRAL COLUMN

[75] Inventors: Chen-Jong Wang; Mong-Song Liang, both of Hsin-chu, Taiwan

[73] Assignee: Taiwan Semiconductor Manufacturing Company Ltd., Hsin-Chu, Taiwan

[21] Appl. No.: 598,782

[22] Filed: Feb. 8, 1996

[51] Int. Cl.⁶ .................. H01L 21/20; H01L 21/8242
[52] U.S. Cl. ............................... 438/397; 438/254
[58] Field of Search .................... 438/239, 240, 438/253, 254, 256, 396, 397, 399

[56] References Cited

U.S. PATENT DOCUMENTS

| | | | |
|---|---|---|---|
| 5,137,842 | 8/1992 | Chan et al. | 438/397 |
| 5,192,703 | 3/1993 | Lee et al. | 438/396 |
| 5,346,844 | 9/1994 | Cho et al. | 438/396 |
| 5,364,809 | 11/1994 | Kwon et al. | 437/52 |
| 5,432,116 | 7/1995 | Keum et al. | 438/397 |
| 5,447,882 | 9/1995 | Kim | 437/60 |
| 5,550,076 | 8/1996 | Chen | 438/253 |
| 5,595,928 | 1/1997 | Lu et al. | 438/396 |
| 5,597,755 | 1/1997 | Ajika et al. | 438/396 |

Primary Examiner—Chandra Chaudhari
Assistant Examiner—Toniae M. Thomas
Attorney, Agent, or Firm—George O. Saile; Stephen B. Ackerman

[57] ABSTRACT

The present invention provides a method of manufacturing a tub structured stacked capacitor having a central column for a dynamic random access memory (DRAM). The method uses only two photo masks to form the capacitor and a chemical mechanical polishing process to eliminate capacitor dielectric integrity problems. A first insulating layer having a contact opening is formed on a substrate. A first polysilicon layer is formed over the first insulation layer and fills the contact hole with polysilicon. Next, the first polysilicon layer over the first insulation layer is chemically mechanically polished to a depth that at least exposes the first insulation layer thereby forming a central vertical extension. An annular trench is formed in the insulating layer surrounding the central vertical extension. A second polysilicon layer and an oxide layer are formed over the trench, the central vertical extension, and the insulation layer. The oxide layer and the second polysilicon layer are then chemically mechanically polished to a depth that at least exposes the first insulation layer thereby forming a storage electrode. A capacitor dielectric layer and a top electrode are sequentially formed over the at least the storage electrode thereby forming a tub structured stacked capacitor having a central column.

20 Claims, 4 Drawing Sheets

METHOD FOR FABRICATING A TUB STRUCTURED STACKED CAPACITOR FOR A DRAM CELL HAVING A CENTRAL COLUMN

BACKGROUND OF INVENTION

1) Field of the Invention

This invention relates generally to the fabrication of capacitors in a dynamic random access memory (DRAM) cell and more particularly to a method for fabricating capacitors with a large capacitance.

2) Description of the Prior Art

A typical DRAM cell consists of a single transistor and a storage capacitor. Digital information is stored in the capacitor and accessed through the transistor, by the way of addressing the desired memory cell, which is connected with other such cells through an array of bit lines and word lines. In order to construct high density DRAMs in a reasonably sized chip area, both the transistor and capacitor element must occupy less lateral space in each memory cell.

As DRAMs are scaled down in dimensions, there is a continuous challenge to maintain a sufficiently high stored charge per capacitor unit area. In dynamic semiconductor memory storage devices it is essential that storage node capacitor cell plates be large enough to retain an adequate voltage level in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM cells continues to increase for future generations of memory devices. The ability to densely pack storage cells while maintaining required storage capability is a crucial requirement of semiconductor manufacturing technologies if future generations of expanded memory array devices are to be successfully manufactured.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors. In order to increase the surface area of the capacitor, there have also been proposed methods of forming a capacitor with a pin structure extending throughout a multi-layer structure of the capacitor to connect the layers with one another, and methods of forming a capacitor using a hemispherical grain polysilicon (HSG) process using polysilicon grains.

A problem with current methods of fabricating capacitors is that "stringers" form between under topography (or on the sidewalls of steep steps) after anisotropic polysilicon etch back steps. Metal stringers often remain behind at the foot or sides of a steep step when an anisotropic etching is used to pattern the polysilicon or metal layers. When fabricating capacitors, a polysilicon layer is anisotropic etched to define the storage electrode (e.g., polysilicon fin etch, stacked capacitor polysilicon etch). Stringers from the polysilicon left over from the anisotropic etch can form on the sidewalls of steep structures, such as gate electrodes, word lines, bit lines, etc. These stringers can short out to other overlying conductive layers causing circuit failure and reducing yields. A common anisotropic polysilicon etch that creates stringers is a $Cl_2$ and HBr etch. Using $SF_6$ in the anisotropic etch strengthens the isotropic nature of the etch, which can reduce stringers, but this induces other problems such as polysilicon undercut and oxide loss.

Workers in the art are aware of the limitation of capacitors and have attempted to resolve them. U.S. Pat. No. 5,447,882 (Kim) teaches a method for fabricating a capacitor having a plurality of recesses in the storage node. The storage node is formed over a contact plug. The storage node is selectively etched in at least two places to form the recesses. U.S. Pat. No. 5,364,809 (Kwon et al.) teaches a method of fabricating a multi-chamber type capacitor. A stack capacitor having a concave area is formed and then oxide spacers are formed in the concave area. A polysilicon layer is formed over the oxide spacers and is etched back to form multiple chambers. However, many of the prior art methods require substantially more processing steps or/and planar structures which make the manufacturing process more complex and costly. Therefore, it is very desirable to develop processes that are as simple as possible and maximize the capacitance per unit area. There is a challenge to develop methods of manufacturing these capacitors that minimize the manufacturing costs and maximize the device yields. In particular, there is a challenge to develop a method which minimizes the number of photoresist masking operations and provides maximum process tolerance to maximize product yields. Moreover, there is a need to develop a process which is not affected by the stringer problem.

SUMMARY OF THE INVENTION

It is an object of the present invention to provide a method for fabricating a tub structured stacked capacitor with a central column which has fewer photolithographic and etch steps than the conventional processes.

It is an object of the present invention to provide a method for fabricating a DRAM having a tub structured capacitor with a central column electrode with a high density and capacitance and prevents the stringer problem.

To accomplish the above objectives, the present invention provides a method of manufacturing a tub structured capacitor with a central column electrode for a dynamic random access memory (DRAM). The method uses only two photo masks to form the capacitor. The method forms the capacitor on a substrate having a device area with a source region formed therein. A first insulating layer is formed over the device area and elsewhere over the substrate. A contact opening is formed exposing portions of the source region. A first polysilicon layer is formed over the first insulation layer and fills the contact hole with polysilicon thereby forming an electrical contact to the source. Next, the first polysilicon layer over the first insulation layer is chemically mechanically polished to a depth that at least exposes the first insulation layer thereby forming a central vertical extension. A trench resist layer is formed over the first insulation layer. The trench resist layer has openings over the active areas. The first insulation layer is anisotropically etched using the trench resist layer as a mask thereby forming an annular trench surrounding the central vertical extension (column). The trench resist layer is then removed. A second polysilicon layer is formed over the trench, the central vertical extension, and the first insulation layer. An oxide layer is formed over the second polysilicon layer. In an important step, the oxide layer, the second polysilicon layer, and the central vertical extension are then chemical-mechanical polished (CMP) to a depth that at least exposes the first insulation layer thereby forming a tub structured storage electrode with a central column. Then, the first insulation layer and the remaining oxide are removed. A capacitor dielectric layer and a top electrode are sequentially formed over the at least the storage electrode thereby forming a tub structured capacitor with a central column.

The current invention provides a simple manufacturing process to produce a capacitor having from 200 to 220% more capacitor per cell area than a convention single walled capacitor. The capacitor is produced using either the same number or fewer masking steps than the conventional single stacked capacitor. Moreover, the process of the invention eliminates the stringer problem because an anisotropic polysilicon etch is not used to define the storage electrode.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a DRAM having a tub structured stacked capacitor with a central column which has small dimensions, high capacitance and is simple to manufacture. The process for forming the field oxide (FOX) and the field effect transistor structure as presently practiced in manufacturing DRAM cells are only briefly described in order to better understand the current invention. Next, the method to fabricate the tub structured stacked capacitor with a central column will be described in detail. The term "substrate" is meant to include devices formed within a semiconductor wafer and the layers overlying the wafer. The term "substrate surface" is meant to include the upper most exposed layers on a semiconductor wafer, such as a silicon surface, an insulating layer and metallurgy lines.

Figure 1:
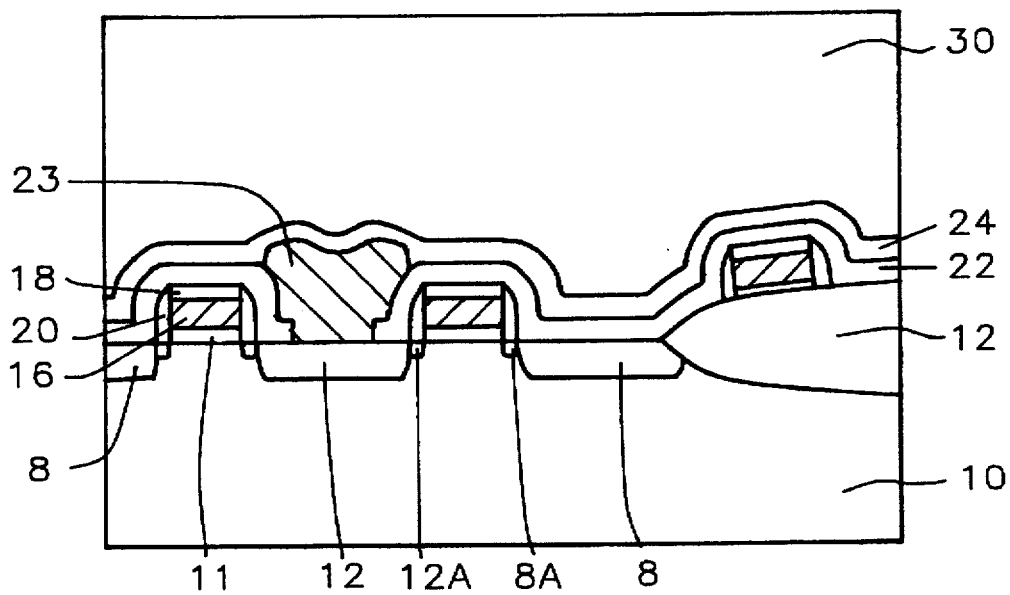
FIGS. 1 through 6 are cross sectional views for illustrating a first embodiment of the method for manufacturing a DRAM having a tub structured stacked capacitor with a central column according to the present invention.

As shown in FIG. 1, the method for fabricating a capacitor begins by providing a substrate having a field oxide layer 12 and FET devices formed thereon. Field oxide layer 12 is formed on a semiconductor substrate 10 for defining active regions and isolation regions. The preferred substrate is composed of a P-type single crystal silicon having a (100) crystallographic orientation. A relatively thick field oxide (FOX) 12 is formed around the active device areas to electrically isolate these areas. One method of forming these regions is described by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions. The preferred thickness of the field oxide is preferably in the range between about 3000 and 6000 Å.

An optional channel stop implant (not shown) can be formed either before or after FOX 12 formation by ion implanting boron at a concentration of between about 2E12 and 5E13 atoms/cm$^2$ and at an energy between about 120 and 180 KeV.

The semiconductor field effect transistor (FET) device is then formed in the active device area. The most commonly used device for dynamic random access memories (DRAM) are metal oxide semiconductor field effect transistors (MOSFET's). The formation of the field effect transistors shown in FIG. 1 will be described next. A gate oxide layer 11 is formed, typically by thermal oxidation of the silicon substrate, with a thickness between about 80 and 160 Å. An appropriately doped polysilicon layer 16, and an insulating layer 18 are deposited on substrate 10 and conventional photolithographic techniques are used to pattern these layers to form the gate electrodes 11 16 18. As shown in FIG. 1, the gates are formed on the substrate disposed between the field oxide regions 12 and on the field oxide regions. The gates on the substrate form the gate electrodes of the MOSFET's in the active device areas. The gates formed over the field oxide 12 form word lines that electrically connect the MOSFET gate electrode to the appropriate peripheral circuits on the DRAM chip.

The lightly doped source/drain 8A 12A of the N-channel MOSFET is formed next, usually by implanting an N-type atomic species such as arsenic or phosphorus through the spaces between the gate electrodes 16 18. For example, a typical implant might consist of phosphorus P31 at a dose of between about 1E13 to 1E14 atoms/cm$^2$ and at an energy between about 30 to 80 Key.

After forming the lightly doped source/drains 8A 12A, sidewall spacers 20 are formed on the gate electrode 11 16 18 sidewalls. These sidewall spacers 20 are preferably formed by depositing a low temperature silicon oxide and anisotropically etching back to the silicon surface. For example, the silicon oxide could be formed by a chemical vapor deposition using tetraethoxysilane also known as tetraethyl orthosilicate (TEOS), at a temperature in the tinge of about 650° to 900° C. and the etch back performed in a low pressure reactive ion etcher with a fluorine gas, such as $C_2F_6$ (carbon hexafluoride) or $CF_4+H_2$ (carbon tetrafluoride and hydrogen).

The source 8/drain 12 regions of the MOSFET are now implanted between the spacers with a N type atomic species, for example, arsenic (As75), to complete the source/drain (i.e., the source is the node contact) 8 12. The implantation is usually done through a thin layer of silicon oxide of about 200 to 300 Å in thickness to minimize implant channeling and to protect against contamination by metals and other impurities. A typical implantation dose is between 2E15 to 1E16 atoms/cm$^2$ and a typical energy is between about 20 to 70 Kev.

As shown in FIG. 1, a first conformal insulating layer 22 is formed over the substrate surface and over the source and drain areas 8 12. The conformal insulating layer 22 can be formed of silicon nitride or undoped silicon oxide. The conformal insulating layer 22 is preferably composed of a silicon oxide such as a TEOS oxide. Layer 22 preferably has a thickness in the range between about 1000 and 3000 Å and more preferably about 1500 Å.

A bit line 23 is then formed by opening up bit line contact opening to the drain 12 and by depositing and patterning a conductive layer thereover. The bit line 23 is preferably formed of a tungsten silicide layer over a doped polysilicon. Preferably the tungsten silicide layer has a thickness in the range of between about 500 and 2500 Å. Preferably the polysilicon layer has a thickness in the range of between about 500 and 2000 Å.

As shown in FIG. 1, a second conformal insulating layer 24 is formed over the bit line 23 and the first conformal layer 22. The conformal insulating layer 24 is preferably composed of a silicon nitride. Layer 24 preferably has a thickness in the range between about 500 and 3000 Å and more preferably about 1500 Å. Layer 24 is used as an etch barrier layer later in the process and has different etch characteristics than the first insulating layer 30 describe below.

Still referring to FIG. 1, a first insulating layer 30 is formed over the second conformal layer 24. The first insulating layer 30 can be formed of a doped or undoped silicon oxide such as P-doped silicon oxide (phosphosilicate glass), Boron-doped silicon oxide, borophosphosilicate glass (BPSG), TEOS and BPTEOS. The first insulating layer 30 is preferably formed of borophosphosilicate glass (BPSG) silicon oxide formed by a chemical vapor deposition (CVD) process.

The first insulating layer is preferably planarized using a chemical mechanical polishing (CMP) process. The wafer is subjected to a chemical mechanical polishing technique which is conducted to at least the point of stopping at the upper surface of layer 30. An example slurry would be the SCI slurry, available from Roden Products Corporation of Newark, Del. USA. Such slurry comprises KOH, $SiO_2$ particles and water. A typical CMP polish time would be from about 1 to 2 minutes. Any residual slurry left on the wafer surface would be removed by a conventional wet cleaning technique.

The first insulating layer 30 preferably has a final thickness in the range of between about 8000 and 15,000 Å and more preferably about 10,000 Å. The thickness of layer 30 in part determines the height of the storage electrode, which effects the cell's capacitance.

The remainder of this description relates more specifically to those objects of the invention, which relate to the formation of the stacked storage capacitor having a smaller size, an increased capacitance, and also providing a more manufacturable process.

Next, a contact hole 42 is formed through the first insulating layer 30 and conformal layers 22 and 24 at least exposing the underlying source region 8. The contact hole 42 can be made by forming a first resist layer over the first insulating layer 30. The first resist layer has a first opening (not shown) over the source region 8. The anisotropic etch preferably has about the same etch rate for the first conformal insulating layer 22, the second conformal insulating layer 24, and the first insulating layer 30. For example, a silicon oxide planarization layer could be etched back in a low pressure reactive ion etcher with a fluorine gas, such as $C_2F_6$ (carbon hexafluoride) or $CF_4 + H_2$ (carbon tetrafluoride and hydrogen). The first resist layer is then removed. The contact hole preferably has a circular shape with a diameter in the range of between about 0.35 and 0.7 and more preferably about 0.5 μm.

Next, a first conductive layer is formed over the first insulating layer, and fills the contact hole 42 thereby forming an electrical contact with the source 8. The first conductive layer is preferably formed of polysilicon doped with an impurity of phosphorus or arsenic. The first conductive layer has a thickness over the first insulating layer 30 in the range of between about 2000 and 7000 fit and more preferably about 5000 Å. The first conductive layer of polysilicon can be deposited by LPCVD (low pressure chemical vapor deposition). This layer is doped by ion implanting with phosphorous or arsenic ions at a dosage between about 5E15 and 2E16 atoms/sq-cm and an energy of between about 20 and 60 Kev., or is doped with phosphorus oxychloride ($POCl_3$) at a temperature of between about 875 and 900 °C., for between about 30 and 50 minutes. Alternately, the polysilicon layer may be doped in situ.

Figure 2:
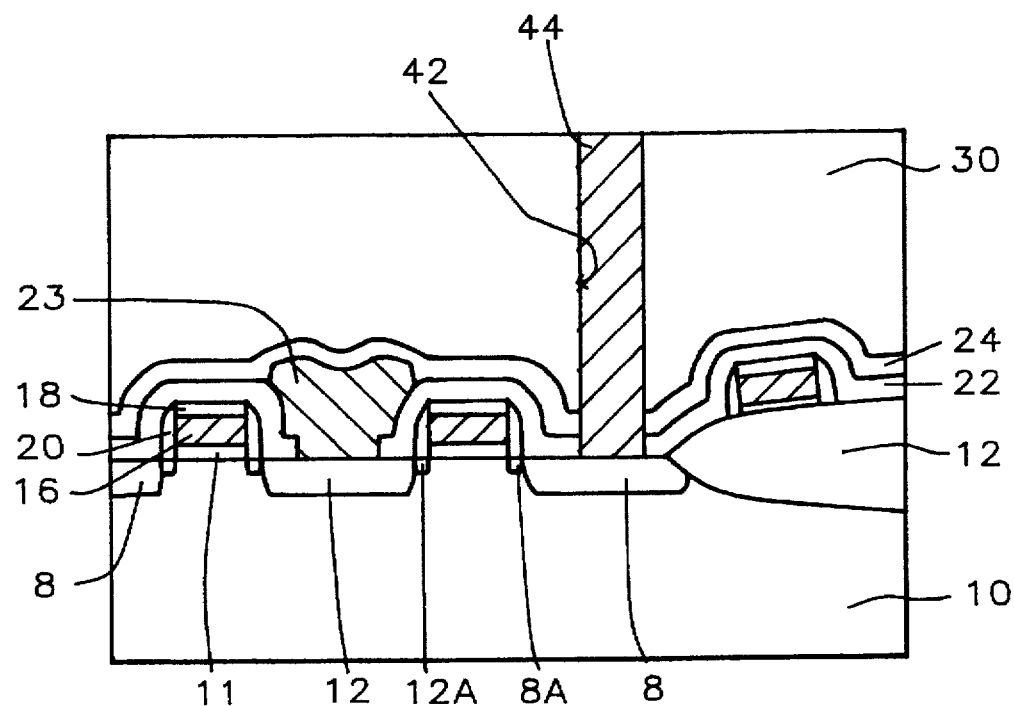

Turning to FIG. 2, the first polysilicon layer over the first insulating layer 30 is chemically mechanically polished to a depth that at least exposes the first insulating layer 30 thereby forming a central vertical extension 44 (i.e., column electrode).

Figure 3:
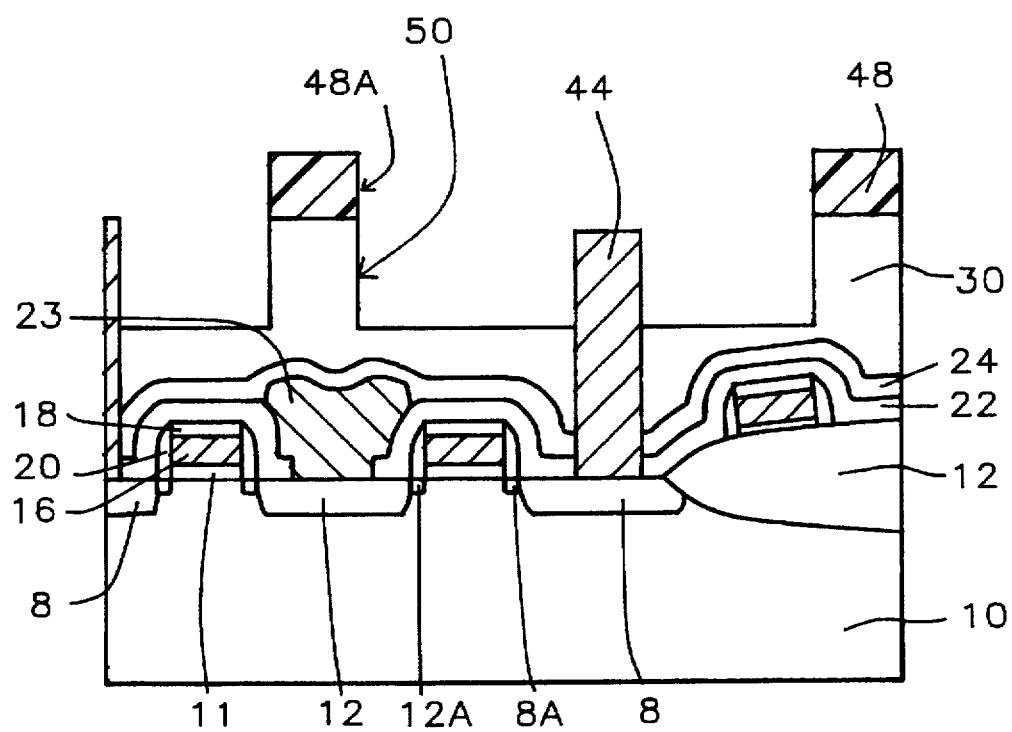

Referring to FIG. 3, an annular trench 50 in the first insulating layer 30 is formed surrounding the central vertical extension 44. The trench can be made by forming a second resist layer 48 over the first insulating layer. The second resist layer 48 has an opening 48A over the active areas (where the storage electrode will be formed). Next, the first insulating layer 30 is anisotropically etched using the second resist layer 48 as a mask thereby forming a trench 50. The trench 50 has vertical sidewalls. The trench can have any shape depending on the application, such as rectangular, square, round, triangular. The trench preferably is rectangular and preferably has a width in the range of between about 0.4 and 0.8 μm and a length in the range of between about 0.8 and 1.2 μm and a depth preferably in the range of between about 2000 and 6000 Å. The resist layer 48 is then removed.

Figure 4:
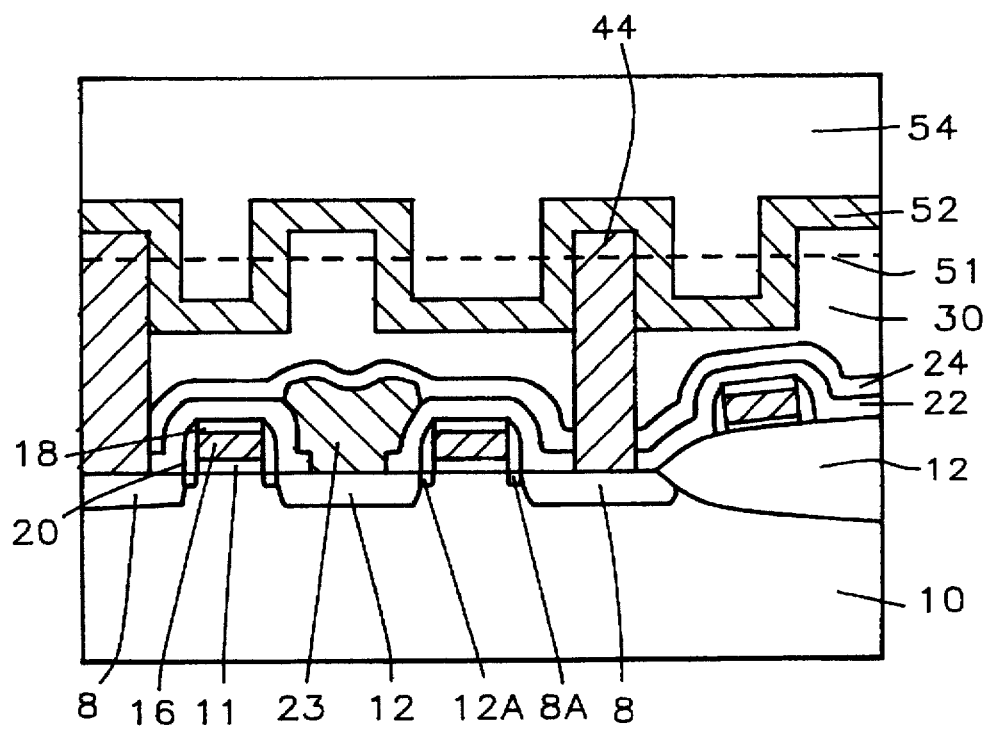

Referring to FIG. 4, a second polysilicon layer 52 is formed over the trench, the central vertical extension 44, and the first insulating layer 30. The second polysilicon layer has a thickness in the range of between about 800 and 2000 Å and more preferably about 1000 Å.

Still referring to FIG. 4, a dielectric layer 54 is formed over the second polysilicon layer 52 and at least fills the trench 44. The dielectric layer 54 is preferably formed of doped or undoped silicon oxide, such as a TEOS oxide, PE-TEOS oxide (plasma enhanced-TEOS oxide), borophosphosilicate glass (BPSG) or BPTEOS. The dielectric layer 54 is more preferably formed of a doped silicon oxide.

Figure 5:
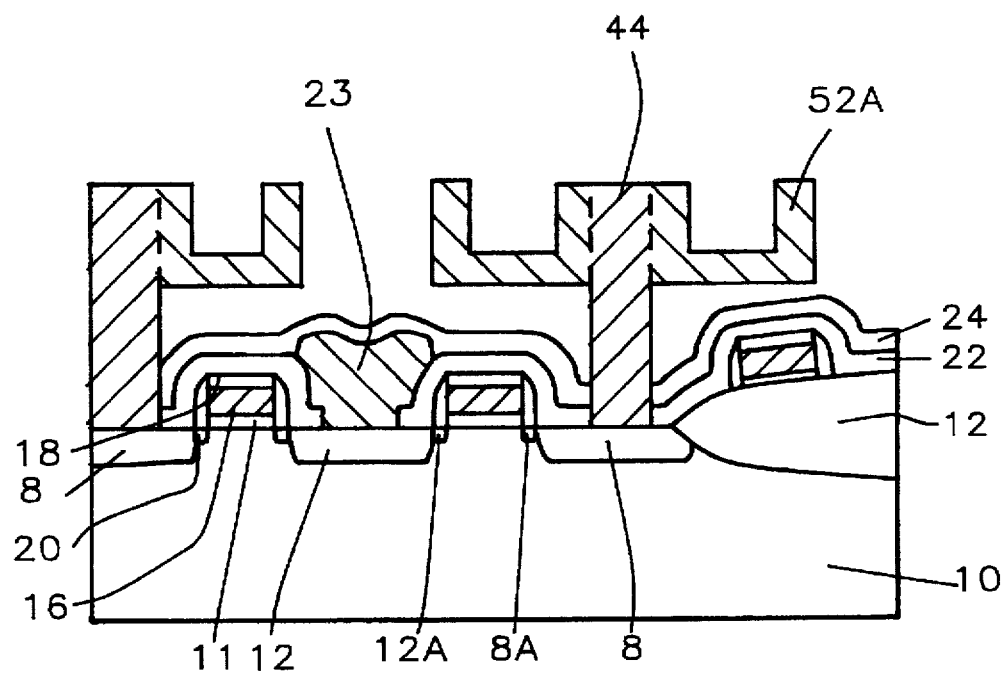

Next, the dielectric layer 54, the second polysilicon layer 52 and the central vertical extension 44 are chemical - mechanical polished (CMP) to a depth that at least exposes the first insulating layer thereby forming a storage electrode 52A 44. See FIGS. 4 and 5. The CMP process removes the polysilicon 52 from the area between the storage electrode walls 52A thereby electrically isolating adjacent electrodes. A portion of the polysilicon 52 over the central extension 44 (column) is also removed. Also, the chemical mechanical polishing steps of the invention eliminate poly etch steps. The CMP process is superior to a polysilicon etch back process because an etch back process can form sharp corners in the storage electrode wall (52A) around the trench wall. For example, the polysilicon in the trench often forms sharp high points at the joint between the polysilicon and first insulating layer. The sharp corners can cause integrity problems with an overlying capacitor dielectric layer 60.

The first insulating layer 30 and the remaining dielectric layer 54 are then removed preferably using a selective wet etch such as a buffered HF solution. The second conformal layer 24 acts as an etch barrier and protects the underlying structures form the etch. The removal of the first insulating layer 30 allows the top electrode 62 to surround the storage electrode 44 52A (e.g., on the bottom) thereby increasing the capacitance of the capacitor 64.

Figure 6:
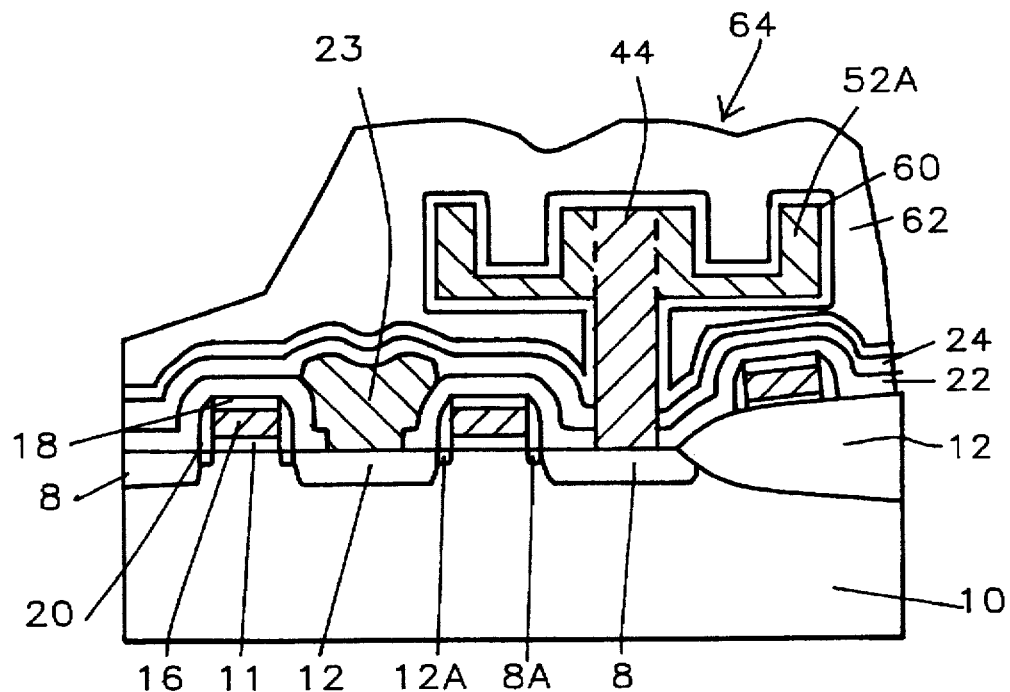

Turning to FIG. 6, a capacitor dielectric layer 60 is formed over the storage electrode 54A 44. The material of the dielectric layer 60 can be any suitable material having a high dielectric constant and being continuous and pinhole free. The capacitor dielectric layer 60 can be formed of silicon nitride, an oxide/nitride/oxide (ONO) film, tantalum pentoxide ($Ta_2O_5$), and silicon oxide material. Preferably, the capacitor dielectric layer is formed of ONO. The capacitor dielectric layer 60 preferably has a thickness in the range between about 40 to 150 Å and more preferably about 60 Å.

A top plate electrode 62 is formed over the capacitor dielectric layer thereby completing the capacitor 64 as shown in FIG. 6. This is accomplished by forming a conductive layer over the resultant surface. The top plate electrode 62 has a thickness in the range between about 1500 and 3500 Å and more preferably about 2000 Å. The top plate electrode is preferably formed a with polycrystalline silicon in-situ doped with an impurity. The top plate electrode preferably has an impurity concentration in the range of between about 1E19 and 1E21 atoms/$cm^3$ and more preferably about 1E20 atoms/$cm^3$.

Figure 7:
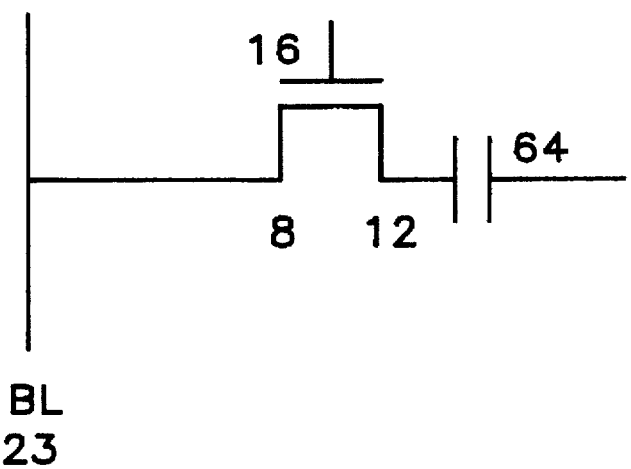
FIG. 7 is an electrical schematic of the memory cell of the present invention.

FIG. 7 is an electrical schematic of the memory cell of the present invention showing the transistor 8 12 16, capacitor 64 and the bit line 23 electrically connected.

Figure 8:
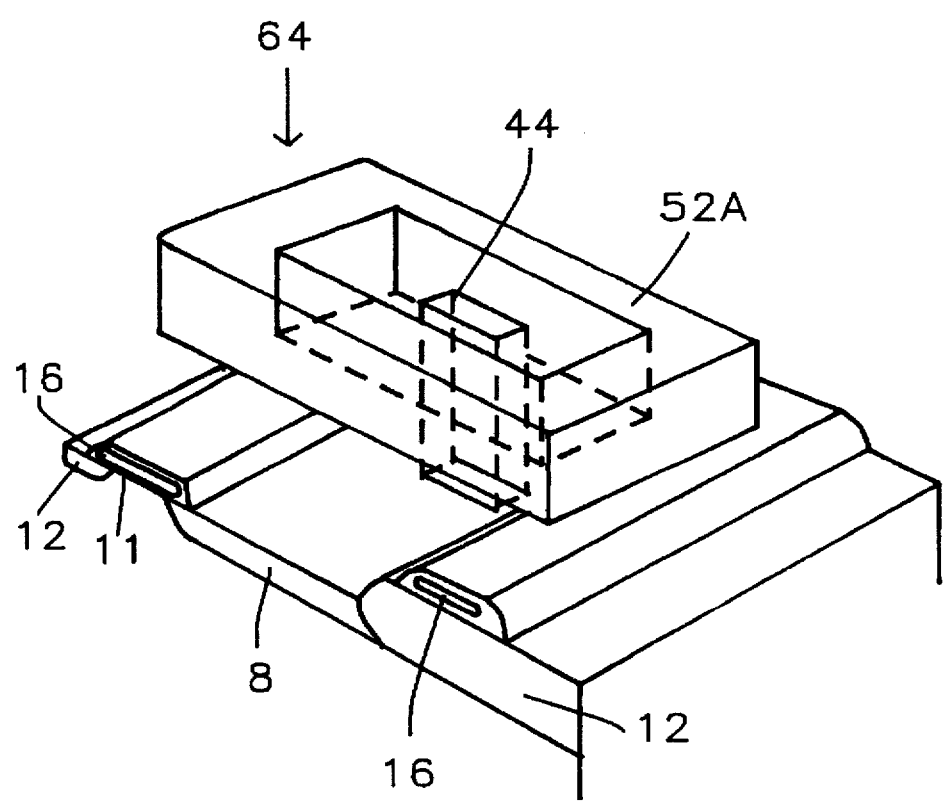
FIG. 8 is a three dimensional view of the stacked capacitor of the present invention.

FIG. 8 shows a three dimensional view of the tub structured stacked capacitor with a central column of the present invention. The tub structure 52A and central column 44 of the capacitor can have other shapes, such as rectangular, square, triangular, depending upon the application as is obvious to one skilled in the art.

The novel process of this invention produces a tub structured stacked capacitor with a central column which requires fewer masking and etch steps than conventional processes. Without adding any photo mask steps, the tub shape capacitor with the central column of the invention increases cell capacitance per unit area by about 200 to 220% compared to a conventional stacked capacitor. Moreover, the process of the invention eliminates the stringer problem because an anisotropic polysilicon etch is not used to define the storage electrode. Also, the chemical mechanical polishing steps of the invention eliminate poly etch steps. The CMP process is superior to a polysilicon etch back process because an etch back process (to form the storage electrode 52A 44) can form sharp corners in the polysilicon layer 52A around the trench wall. For example, the polysilicon in the trench often forms sharp high points at the joint between the polysilicon and first insulation layer. The sharp corners can cause integrity problems with an overlying capacitor dielectric layer 60.

It should be will understood by one skilled in the art that by including additional process steps not described in this embodiment, other types of devices can also be included on the DRAM chip. For example, P wells in the P substrate and CMOS circuit can be formed therefrom. It should also be understood that the figures depict only one DRAM storage cell out of a multitude of cells that are fabricated simultaneously on the substrate. Also, the capacitor can be used in other chip types in addition to DRAM chips. It should be also understood that the figures depict only one DRAM storage cell out of a multitude of cells that are fabricated simultaneously on the substrate.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a tub structured capacitor having a central column for a memory device on a substrate; said substrate having a device area with a source region formed therein, comprising the steps of:

a) forming an etch barrier layer over said device area and elsewhere over said substrate;

b) forming a first insulating layer over said etch barrier layer;

c) forming a contact opening in said first insulating layer and said etch barrier layer exposing portions of said source region;

d) forming a first conductive layer over said first insulating layer and filling said contact opening thereby forming an electrical contact to said source region;

e) chemically mechanically polishing said first conductive layer over said first insulating layer to a depth that at least exposes said first insulating layer thereby forming a central vertical extension;

f) forming a trench resist layer over said first insulating layer; said trench resist layer having an opening over said active area;

g) anisotropically etching said first insulating layer using said trench resist layer as a mask thereby forming a trench surrounding said central vertical extension; said trench having vertical sidewalls;

h) forming a second conductive layer over said trench, said central vertical extension and said first insulating layer;

i) forming an dielectric layer over said second conductive layer and at least filling said trench;

j) chemically mechanically polishing said dielectric layer, said second conductive layer, and said central vertical extension to a depth that at least exposes said first insulating layer thereby forming a storage electrode;

k) removing said first insulating layer and the remaining dielectric layer; and l) sequentially forming a capacitor dielectric layer and a top electrode over said at least said storage electrode thereby forming said tub structured capacitor having said central column.

2. The method of claim 1 wherein a first conformal layer composed of silicon oxide is formed over said device area, and elsewhere over said substrate, before forming said etch barrier layer; and said etch barrier layer is a second conformal layer composed of silicon nitride.

3. The method of claim 2 wherein the silicon oxide layer has a thickness in the range of between about 1000 and 3000 Å.

4. The method of claim 1 wherein said first insulating layer is composed of a material selected from the group consisting of: borophosphosilicate glass (BPSG) doped silicon oxide, and undoped silicon oxide; and has a thickness in the range of between about 8000 and 15,000 Å.

5. The method of claim 1 which further includes after step (b): planarizing said first insulating layer by a chemical mechanical polishing process.

6. The method of claim 1 wherein said contact hole has a circular shape with a diameter in the range of between about 0.25 and 0.70 μm.

7. The method of claim 1 wherein said first conductive layer is composed of polysilicon and has a thickness in the range of between about 2000 and 7000 Å.

8. The method of claim 1 wherein said second conductive layer is composed of polysilicon and has a thickness in the range of between about 800 and 2000 Å.

9. The method of claim 1 wherein said trench has a rectangular shape with a width in the range of between about 0.4 and 0.8 µm, and a length in the range of between about 0.8 and 1.2 µm and a depth in the range of between about 2000 and 6000 Å.

10. The method of claim 1 wherein said capacitor dielectric layer is composed of a material selected from the group consisting of: a three layer structure of silicon oxide/silicon nitride/silicon oxide (ONO), a two layer structure of silicon oxide/silicon nitride (ON), and silicon nitride; and said capacitor dielectric layer has a thickness in the range of between about 40 and 150 Å.

11. The method of claim 1 wherein said first conductive layer is polysilicon doped with an impurity selected from the group consisting of: phosphorus and arsenic; and said first conductive layer has an impurity concentration in the range of between about 1E19 and 1E21 atoms/cm$^3$ and a thickness over said first insulating layer in the range of between about 2000 and 7000 Å.

12. A method of fabricating a dynamic random access memory cell having an tub structured capacitor with a central column on a substrate, comprising the steps of:

a) forming a MOS (metal oxide semiconductor) device, having source and drain regions, adjacent to a field oxide region in a silicon substrate;

b) forming a conductive word line over said field oxide region;

c) forming an etch barrier layer over said substrate, including said MOS device, said word line, and said field oxide region;

d) forming a first insulating layer over said etch barrier layer;

e) planarizing said first insulating layer by a chemical mechanical polishing process;

f) forming a first resist layer over said first insulating layer; said first resist layer having an first opening over said source region;

g) anisotropically etching said first insulating layer through said first opening forming a contact hole exposing portions of said source region;

h) removing said first resist layer;

i) forming a first conductive layer over said first insulating layer and filling said contact hole thereby forming an electrical contact to said source region;

j) chemically mechanically polishing said first conductive layer over said first insulating layer to a depth that at least exposes said first insulating layer thereby forming a central vertical extension;

k) forming a second resist layer over said first insulating layer; said second resist layer having an opening over an area where a storage electrode will be formed;

l) anisotropically etching said first insulating layer using the second resist layer as a mask thereby forming a trench surrounding said central vertical extension; said trench having vertical sidewalls;

m) forming a second conductive layer over said trench, said central vertical extension, and said first insulating layer;

n) forming an dielectric layer over said second conductive layer and filling said trench;

o) chemically mechanically polishing said dielectric layer, said second conductive layer, and said central vertical extension to a depth that at least exposes said first insulating layer thereby forming a storage electrode;

p) removing said first insulating layer and said dielectric layer; and q) sequentially forming a capacitor dielectric layer and a top electrode over said at least said storage electrode thereby forming said tub structured capacitor having said central column.

13. The method of claim 12 wherein a first conformal layer composed of silicon oxide is formed over said metal oxide semiconductor device, said word line, said field oxide region, and said substrate.

14. The method of claim 12 wherein said etch barrier layer is composed of silicon nitride and has a thickness in the range of between about 500 and 3000 Å.

15. The method of claim 12 wherein said first insulating layer is composed of a material selected from the group consisting of: borophosphosilicate glass, doped silicon oxide, and undoped silicon oxide; and said first insulation layer has a thickness in the range of between about 8000 and 15,000 Å.

16. The method of claim 12 wherein said contact hole has a circular shape with a diameter in the range of between about 0.35 and 0.7 µm.

17. The method of claim 12 wherein said first conductive layer is composed of polysilicon and has a thickness in the range of between about 2000 and 7000 Å.

18. The method of claim 12 wherein said second conductive layer is composed of polysilicon and has a thickness in the range of between about 800 and 2000 Å.

19. The method of claim 12 wherein said trench having a rectangular shape with a width in the range of between about 0.4 and 0.8 µm and a length in the range of between about 0.8 and 1.2 µm and a depth in the range of between about 2000 and 6000 Å.

20. The method of claim 12 wherein said capacitor dielectric layer is composed of a material selected from the group consisting of: a three layer structure of silicon oxide/silicon nitride/silicon oxide (ONO), a two layer structure of silicon oxide/silicon nitride (ON), and silicon nitride; said capacitor dielectric layer has a thickness in the range of between about 40 and 150 Å.

* * * * *